(12) United States Patent
Oh et al.

(10) Patent No.: US 11,232,840 B2
(45) Date of Patent: Jan. 25, 2022

(54) SEMICONDUCTOR DEVICE INCLUDING PAGE BUFFER

(71) Applicant: SK hynix Inc., Icheon-si (KR)

(72) Inventors: Sung Lae Oh, Icheon-si (KR); Dong Hyuk Kim, Icheon-si (KR); Tae Sung Park, Icheon-si (KR); Soo Nam Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/932,522

(22) Filed: Jul. 17, 2020

(65) Prior Publication Data

US 2021/0241835 A1 Aug. 5, 2021

(30) Foreign Application Priority Data

Feb. 5, 2020 (KR) .................. 10-2020-0013596

(51) Int. Cl.
*G11C 16/24* (2006.01)

(52) U.S. Cl.
CPC .................................. *G11C 16/24* (2013.01)

(58) Field of Classification Search
CPC ...................................................... G11C 16/24
USPC ...................................................... 365/189.05
See application file for complete search history.

(56) References Cited

U.S. PATENT DOCUMENTS

| 5,625,590 | A | * | 4/1997 | Choi | .............. | G11C 16/10 365/185.17 |
| 8,976,601 | B2 | | 3/2015 | Oh et al. | | |
| 9,159,457 | B2 | * | 10/2015 | Yun | .............. | G11C 29/36 |
| 9,460,793 | B1 | * | 10/2016 | Oh | .............. | G11C 16/08 |
| 9,965,388 | B2 | * | 5/2018 | Chun | .............. | G11C 7/106 |
| 10,497,448 | B2 | * | 12/2019 | Arakawa | .............. | G11C 16/24 |
| 2006/0285376 | A1 | * | 12/2006 | Kwak | .............. | H01L 27/10 365/63 |
| 2007/0171715 | A1 | * | 7/2007 | Lee | .............. | G11C 16/10 365/185.12 |
| 2008/0101120 | A1 | * | 5/2008 | Park | .............. | G11C 16/10 365/185.12 |
| 2012/0008418 | A1 | * | 1/2012 | Huh | .............. | G11C 16/26 365/185.25 |
| 2012/0314506 | A1 | * | 12/2012 | Baek | .............. | G11C 7/12 365/185.25 |

(Continued)

FOREIGN PATENT DOCUMENTS

KR 10-1585134 B1 10/2015

*Primary Examiner* — Sung Il Cho

(57) ABSTRACT

A semiconductor device including a page buffer is disclosed, which reduces the number of lines of the page buffer. The semiconductor device includes a plurality of bit lines, classified into a first group and a second group, that are arranged alternating, a first page buffer circuit coupled to the plurality of bit lines and a plurality of connection lines corresponding to the plurality of bit lines, and a second page buffer circuit coupled to the plurality of connection lines. Each of the first group and the second group includes a plurality of bit-line pairs classified into odd bit lines and even bit lines. The plurality of connection lines includes odd connection lines and even connection lines, and odd connection lines corresponding to the odd bit lines are arranged contiguous to each other, and even connection lines corresponding to the even bit lines are arranged contiguous to each other.

19 Claims, 18 Drawing Sheets

(56) References Cited

U.S. PATENT DOCUMENTS

| | | | |
|---|---|---|---|
| 2013/0135930 A1* | 5/2013 | Oh | H01L 27/11529 365/185.05 |
| 2014/0185353 A1* | 7/2014 | Oh | G11C 7/18 365/63 |
| 2014/0307498 A1* | 10/2014 | Lim | G11C 29/52 365/63 |
| 2016/0240232 A1* | 8/2016 | Lee | H01L 27/1052 |
| 2018/0137920 A1* | 5/2018 | Song | G11C 16/24 |
| 2018/0226128 A1* | 8/2018 | Park | G11C 7/12 |
| 2018/0277225 A1* | 9/2018 | Park | G11C 11/5621 |
| 2020/0160910 A1* | 5/2020 | Hsu | G11C 11/5628 |
| 2021/0035647 A1* | 2/2021 | Senoo | G11C 16/26 |

* cited by examiner

| | | | | | |
|---|---|---|---|---|---|
| HV-4 stack | | | | | |
| E0 | E3 | E4 | E7 | LV | (A) |
| O0 | O3 | O4 | O7 | LV | |
| E0 | E3 | E4 | E7 | Ca | |
| O0 | O3 | O4 | O7 | Ca | |
| CSDEC & Cache | | | | | |
| O1 | O2 | O5 | O6 | Ca | |
| E1 | E2 | E5 | E6 | Ca | |
| O1 | O2 | O5 | O6 | LV | (B) |
| E1 | E2 | E5 | E6 | LV | |
| HV-8 stack | | | | | |
| E0 | E3 | E4 | E7 | LV | (C) |
| O0 | O3 | O4 | O7 | LV | |
| E0 | E3 | E4 | E7 | Ca | |
| O0 | O3 | O4 | O7 | Ca | |
| CSDEC & Cache | | | | | |
| O1 | O2 | O5 | O6 | Ca | |
| E1 | E2 | E5 | E6 | Ca | |
| O1 | O2 | O5 | O6 | LV | (D) |
| E1 | E2 | E5 | E6 | LV | |
| HV-8 stack | | | | | |
| E4 | E7 | E0 | E3 | LV | (E) |
| O4 | O7 | O0 | O3 | LV | |
| E4 | E7 | E0 | E3 | Ca | |
| O4 | O7 | O0 | O3 | Ca | |
| CSDEC & Cache | | | | | |
| O5 | O6 | O1 | O2 | Ca | |
| E5 | E6 | E1 | E2 | Ca | |
| O5 | O6 | O1 | O2 | LV | (F) |
| E5 | E6 | E1 | E2 | LV | |
| HV-4 stack | | | | | |

FIG.13

SEMICONDUCTOR DEVICE INCLUDING PAGE BUFFER

CROSS-REFERENCE TO RELATED APPLICATION

This patent document claims priority under 35 U.S.C. § 119 to, and the benefits of, Korean patent application No. 10-2020-0013596, filed on Feb. 5, 2020, which is hereby incorporated in its entirety by reference.

TECHNICAL FIELD

The technology and implementations disclosed herein generally relate to a semiconductor device including a page buffer, and more particularly to a technology for reducing the number of lines contained in the page buffer.

BACKGROUND

Whereas volatile memory devices can perform write and read operations of data at relatively higher speeds, volatile memory devices have disadvantages in that stored data is unavoidably lost when power supply is stopped. In contrast, whereas non-volatile memory devices can perform write and read operations of data at relatively lower speeds, the non-volatile memory devices have advantages in that stored data can remain unchanged even when power supply is stopped. As a result, in order to stably store data to be maintained irrespective of power supply, non-volatile memory devices have generally been used.

Examples of non-volatile memory devices include read only memory (ROM), mask ROM (MROM), programmable ROM (PROM), erasable programmable ROM (EPROM), electrically erasable programmable ROM (EEPROM), flash memory, phase change random access memory (PRAM), magnetic RAM (MRAM), resistive RAM (RRAM), and ferroelectric RAM (FRAM). Some flash memories may be classified as a NOR flash memory device or a NAND flash memory device.

NAND flash memory devices have been mainly used as data storage devices. The NAND flash memory devices may perform operations needed to read and output data stored in memory cells using a plurality of page buffers.

SUMMARY

Various embodiments of the disclosed technology relate to a semiconductor device including a page buffer that reduces the number of lines contained in the page buffer during a bit-line stress test mode.

In accordance with an embodiment of the disclosed technology, a semiconductor device may include a plurality of bit lines classified into a first group and a second group, that are arranged in a first direction alternating between first group bit lines and second group bit lines, a first page buffer circuit coupled to the plurality of bit lines and a plurality of connection lines corresponding to the plurality of bit lines, and a second page buffer circuit coupled to the plurality of connection lines. Each of the first group and the second group may include a plurality of bit-line pairs classified into odd bit lines and even bit lines. The plurality of connection lines includes odd connection lines and even connection lines. Odd connection lines corresponding to the odd bit lines may be arranged contiguous to each other in the first direction, and even connection lines corresponding to the even bit lines may be arranged contiguous to each other in the first direction.

In accordance with another embodiment of the disclosed technology, a semiconductor device may include a plurality of bit lines, classified into a first group and a second group, that are arranged in a first direction alternating between first group bit lines and second group bit lines, and a plurality of page buffers coupled to the plurality of bit lines and a plurality of connection lines corresponding to the plurality of bit lines. Each of the first group and the second group may include a plurality of bit-line pairs classified into odd bit lines and even bit lines. The plurality of page buffers may include a plurality of odd page buffers coupled to odd connection lines of the first group and the second group, and the odd page buffers are arranged contiguous to each other in a first direction, and a plurality of even page buffers coupled to even connection lines of the first group and the second group, and the even page buffers are arranged contiguous to each other in the first direction.

It is to be understood that both the foregoing general description, and the following detailed description, of the technology disclosed herein are illustrative and explanatory and intended to provide further explanation of the scope of the disclosure to those skilled in the art.

BRIEF DESCRIPTION OF THE DRAWINGS

The above and other features and beneficial aspects of the disclosed technology will become readily apparent with reference to the following detailed description when considered in conjunction with the accompanying drawings.

FIG. 13 is a schematic diagram illustrating page buffer circuits shown in FIGS. 4 to 12 stacked in multiple stages.

DETAILED DESCRIPTION

This patent document provides implementations and examples of a semiconductor device including a page buffer that substantially addresses one or more issues due to limitations and disadvantages of the related art. Some implementations of the disclosed technology suggest a semiconductor device including a page buffer, which can reduce the number of lines contained in the page buffer during a bit-line stress test mode. The disclosed technology provides various implementations of a semiconductor device having a page buffer, which can improve a layout structure of lines contained in the page buffer during a bit-line stress test mode.

Reference will now be made in detail to aspects of the disclosed technology, embodiments and examples of which are illustrated in the accompanying drawings. Wherever possible, the same reference numbers are used throughout the drawings to refer to the same or like portions.

In association with the embodiments of the disclosed technology, specific structural and functional descriptions are disclosed only for illustrative purposes. The embodiments represent a limited number of possible embodiments. Embodiments of the disclosed technology can be implemented in various ways without departing from the scope or spirit of the disclosed technology.

In describing the disclosed technology, the terms "first" and "second" may be used to describe multiple components, but the components are not limited by the terms in number or order. The terms may be used to distinguish one component from another component. For example, a first component may be called a second component and a second component may be called a first component without departing from the scope of the disclosed technology.

The terms used in the present application are merely used to describe specific embodiments and are not intended to limit the disclosed technology. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning in the context of the relevant art and should not be analyzed to have an ideal meaning or an excessively formal meaning unless clearly defined in the present application. The terminology used in the disclosed technology is for the purpose of describing particular embodiments only and is not intended to limit the disclosure.

Figure 1:
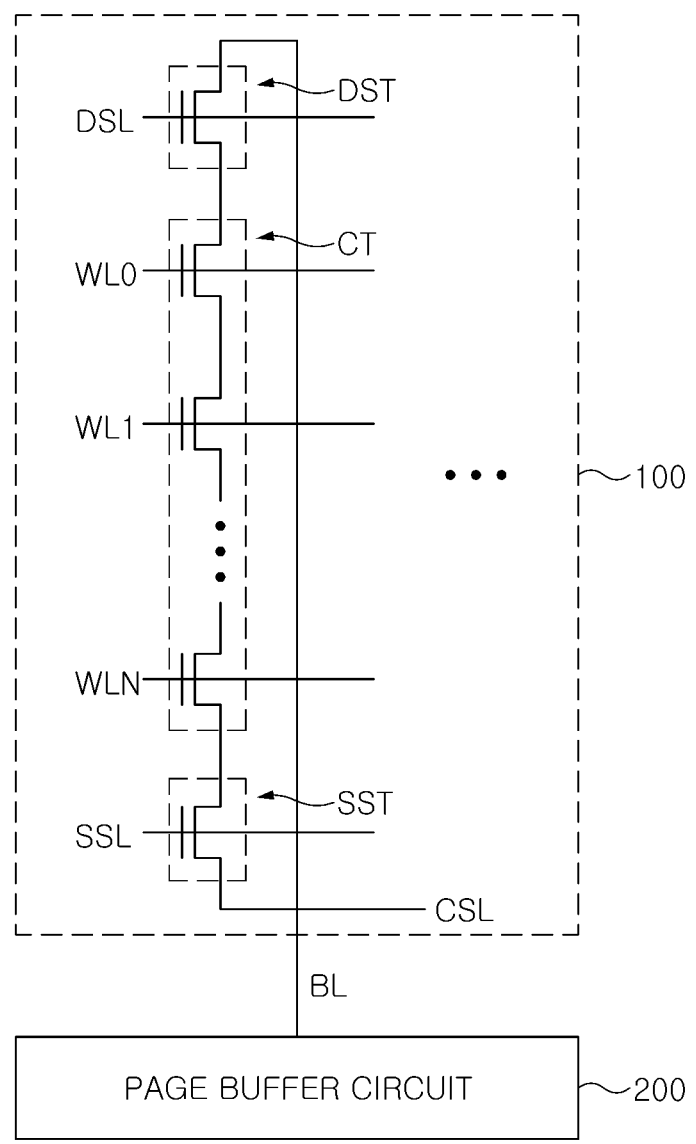
FIG. 1 is a circuit diagram illustrating a unit cell structure and a page buffer circuit for use in a semiconductor device in accordance with an embodiment of the disclosure.

FIG. 1 is a circuit diagram illustrating a unit cell structure and a page buffer circuit for use in a semiconductor device in accordance with an embodiment of the disclosure.

Referring to FIG. 1, a semiconductor device 10 may include a memory cell array 100 and a page buffer circuit 200. The memory cell array 100 may include memory cells formed at intersection regions of one or more bit lines (BL) and word lines (WL).

The memory cell array 100 may include a drain selection transistor DST, a plurality of cell transistors (CT), and a source selection transistor SST. In a single cell string, the drain selection transistor DST, the cell transistors (CT), and the source selection transistor SST may be coupled in series to one another.

The drain selection transistor DST may transmit signals from the bit line (BL) to the cell transistors (CT) in response to the drain selection signal DSL. The cell transistors (CT) may selectively store data received from the drain selection transistor DST in response to a plurality of word lines WL<0:N>. In addition, the source selection transistor SST may transmit data received from the cell transistors (CT) to a common source line CSL in response to a source selection signal SSL.

The page buffer circuit 200 may temporarily store data received from the bit line BL, or may transmit the stored data to the bit line (BL). The page buffer circuit 200 may be coupled to the memory cell array 100 through either the bit line (BL) or lines connected to the bit line (BL).

The higher the density of the memory cell array 100, the higher the number of signal lines arranged or disposed in the page buffer circuit 200. During a mode of testing stress of the bit line (BL), lines of the bit lines (BL) may be classified into even lines and odd lines such that the even lines and odd lines can be alternately arranged. However, in the case of detecting a defect or faulty part of such lines using the above-mentioned testing method, even lines need to be independently controlled from odd lines, such that the number of lines needed to control the even lines and the odd lines may unavoidably increase.

Therefore, embodiments disclosed herein include semiconductor devices that may distinguish even lines and odd lines from each other using the page buffer circuit 200, so that page buffers coupled to the even lines are arranged contiguous to each other and page buffers coupled to the odd lines are arranged contiguous to each other.

The semiconductor device disclosed in embodiments may distinguish even lines and odd lines from each other in even bit-line groups of the page buffer group 200, such that the even lines are arranged contiguous to each other, and the odd lines are arranged contiguous to each other, in the even bit line groups. Embodiments of the semiconductor devices disclosed herein may distinguish even lines and odd lines from each other in odd bit line groups, such that the even lines are arranged contiguous to each other, and the odd lines are arranged contiguous to each other, in the odd bit line groups. Therefore, the semiconductor device according to the embodiments can reduce the number of lines contained in the page buffer circuit 200, and at the same time can test stress of one or more bit lines (BL).

Figure 2:
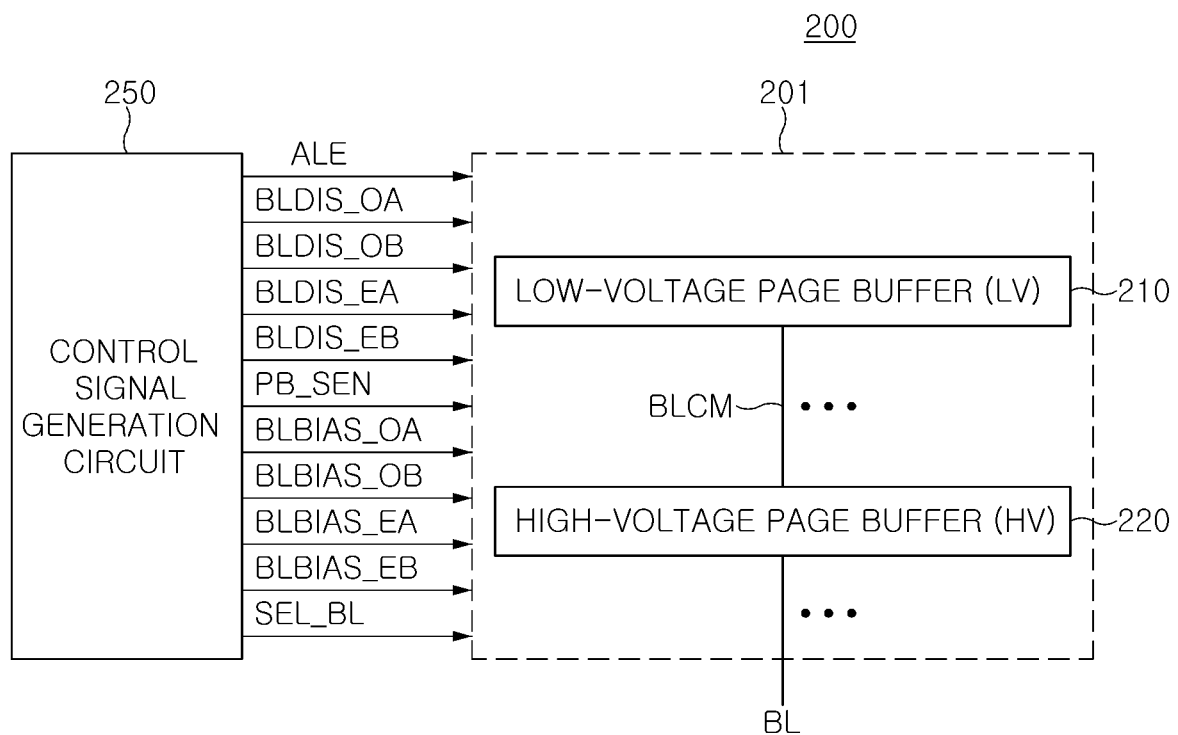
FIG. 2 is a detailed schematic diagram illustrating the page buffer circuit shown in FIG. 1.

FIG. 2 is a detailed schematic diagram illustrating the page buffer circuit shown in FIG. 1.

Referring to FIG. 2, a page buffer circuit 200 may include a buffer circuit 201 and a control signal generation circuit 250. The buffer circuit 201 may include a low-voltage page buffer 210 (LV) (i.e., a second page buffer circuit) and a high-voltage page buffer 220 (HV) (i.e., a first page buffer circuit).

The low-voltage page buffer 210 (LV) may be coupled to the high-voltage page buffer 220 (HV), such that the low-voltage page buffer 210 (LV) can selectively discharge a voltage of a bit-line connection node (BLCM).

The high-voltage page buffer 220 (HV) may be coupled to the bit line (BL), and may thus provide a high voltage (i.e., a first voltage) needed to test the bit line (BL). The high-voltage page buffer 220 may be located or disposed in an area or region that is closer to the memory cell array 100 than the low-voltage page buffer 210.

The low-voltage page buffer 210 and the high-voltage page buffer 220 may be coupled to each other through the bit-line connection node (BLCM). The bit-line connection node (BLCM) may be a line that connects or couples the low-voltage page buffer 210 and the high-voltage page buffer 220.

The bit-line connection node (BLCM) may be coupled to the bit line (BL) through the high-voltage page buffer 220. The bit-line connection node (BLCM) is disposed between the low-voltage page buffer 210 and the high-voltage page buffer 220. For example, the bit-line connection node (BLCM) may refer to a lower conductive line constructing the bit line (BL).

The low-voltage page buffer 210 and the high-voltage page buffer 220 may be controlled by the control signal generation circuit 250. That is, the buffer circuit 201 may receive a latch enable signal (ALE) and page buffer control signals BLDIS_OA, BLDIS_OB, BLDIS_EA, BLDIS_EB, PB_SEN, BLBIAS_OA, BLBIAS_OB, BLBIAS_EA, BLBIAS_EB, and SEL_BL from the control signal generation circuit 250. In an example, the latch enable signal (ALE) may be an address latch enable signal for latching data into the page buffer circuit according to the address that was received. A detailed description of the above-mentioned page buffer control signals will be described below.

Figure 3:
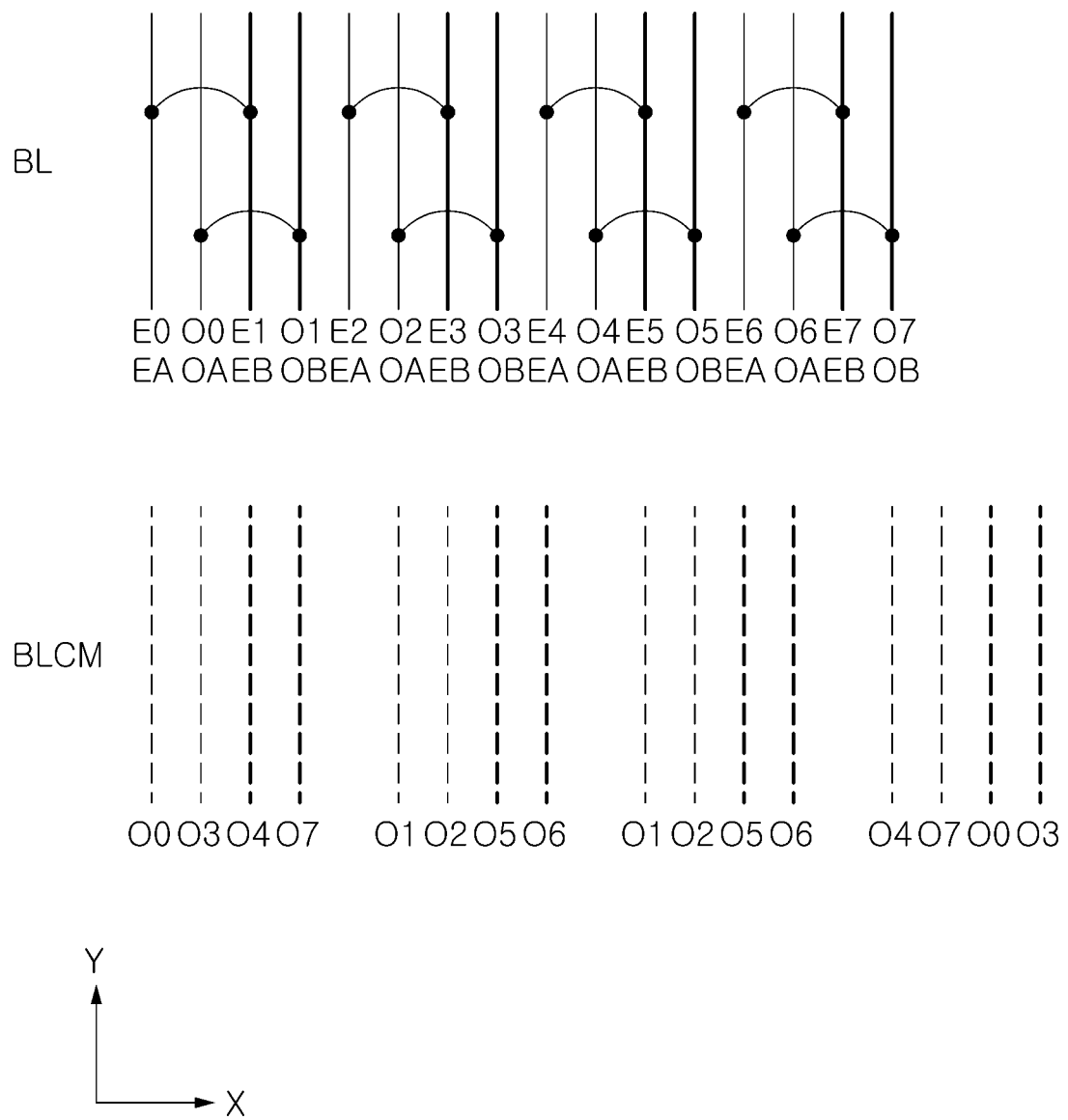
FIG. 3 is a schematic diagram illustrating patterns of bit lines and patterns of bit-line connection nodes for use in the page buffer circuit shown in FIG. 2.

FIG. 3 is a schematic diagram illustrating patterns of the bit lines (BL) and patterns of the bit-line connection nodes (BLCM) for use in the page buffer circuit shown in FIG. 2.

Referring to FIG. 3, a semiconductor device according to an embodiment of the disclosure may include a plurality of bit lines (BL). A pair of even bit lines and a pair of odd bit lines from among a plurality of bit lines (BL) may be alternately arranged or disposed. In a bit-line stress test mode, when bias power is applied to the pair of even (or odd) bit lines and a bridge occurs in contiguous bit lines, so that leakage may occur through the pair of odd (or even) bit lines.

For example, the plurality of bit lines (BL) may be arranged in the following order: E0→O0→E1→O1→E2→O2→E3→O3→E4→O4→E5→O5→E6→O6→E7→O7.

In the above example, the plurality of bit lines (BL) may be classified into pairs of even bit lines (i.e., even bit line pairs) and pairs of odd bit lines (i.e., odd bit line pairs). The even bit line pairs include E0/O0, E2/O2, E4/O4, and E6/O6, and each of the even bit line pairs may be denoted as a group A (EA, OA) pair. The odd bit line pairs include E1/O1, E3/O3, E5/O5, and E7/O7, and each of the odd bit line pairs may be denoted as a group B (EB, OB) pair. Group A even bit line pairs may alternate with Group B odd bit line pairs.

The even bit line pairs E0/O0, E2/O2, E4/O4, and E6/O6 may also be classified into even bit lines and odd bit lines. In addition, the odd bit line pairs E1/O1, E3/O3, E5/O5, and E7/O7 may also be classified into even bit lines and odd bit lines. For convenience of description, the even lines use "E" (for "even") as a prefix, and the odd lines use "O" (for "odd") as a prefix.

In addition, a stress voltage may be applied to the even bit line pairs in group A (EA, OA), and zero voltage "0V" may be applied to the odd bit line pairs in group B (EB, OB), such that stress of bit lines (BL) can be tested.

If lines of the bit-line connection nodes (BLCM) are arranged in the page buffer circuit 200 for testing the stress of the bit lines (BL), then the number of global signals may increase. Performance or throughput of a power-supply circuit may deteriorate so that it becomes difficult to guarantee the operational reliability of the page buffer circuit 200.

Therefore, semiconductor devices according to embodiments of the disclosure may group the plurality of bit line pairs into group A (even group) or group B (odd group) bit line pairs. In the process of arranging bit-line connection nodes (BLCM) in the page buffer circuit 200, an odd connection line that corresponds to an odd bit line of the group A, and an odd connection line that corresponds to an odd bit line of the group B, may be arranged contiguous or next to one another, and an even connection line corresponding an even bit line of the group A, and an even connection line corresponding to an even bit line of the group B, may be arranged to be adjacent one another.

For example, in one bit line connection node (BLCM), the odd connection line (O0) from group A, the odd connection line (O3) from group B, the odd connection line (O4) from group A, and the odd connection line (O7) from the group B may be sequentially arranged.

Figure 4:
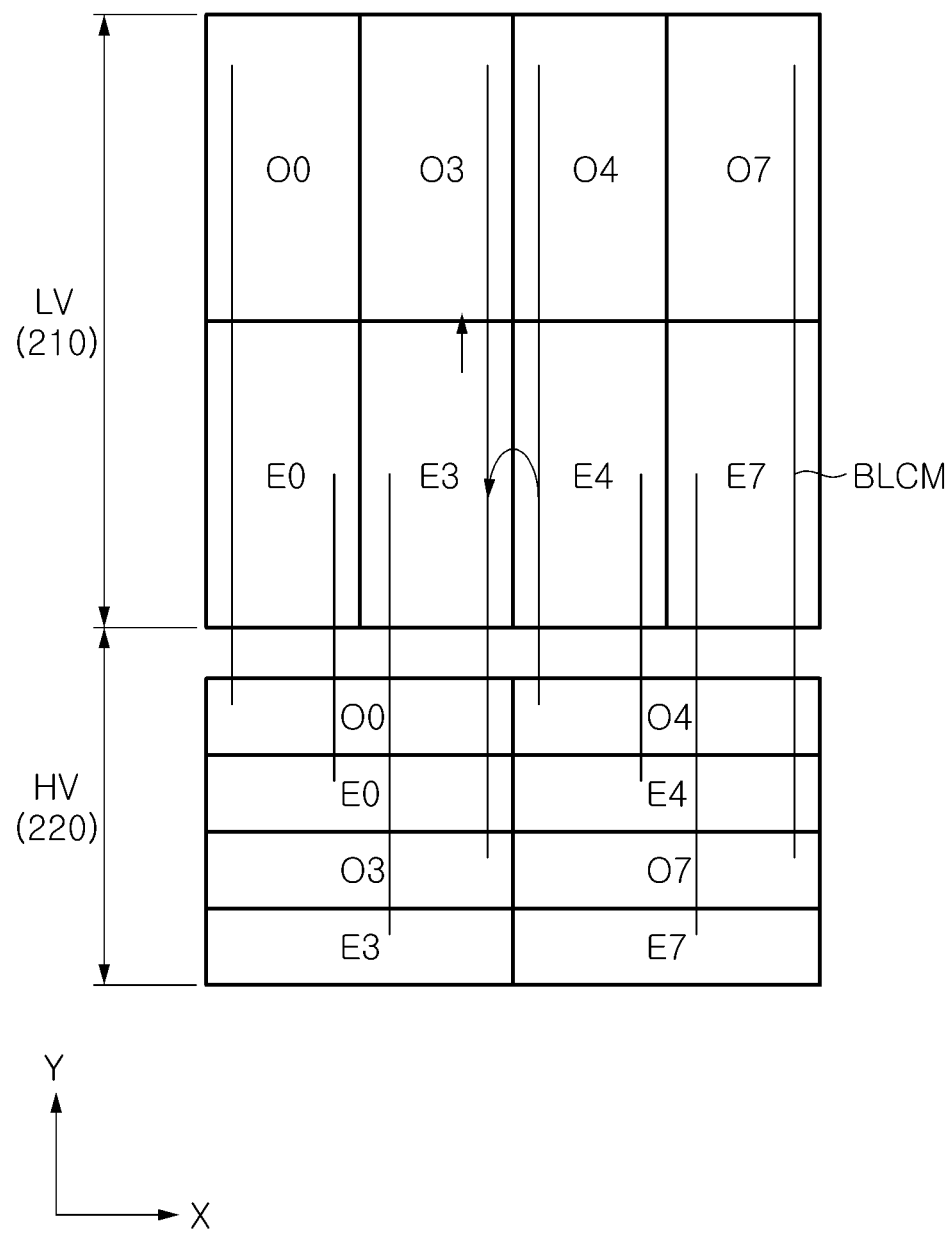
FIG. 4 is a schematic diagram illustrating patterns of bit-line connection nodes for use in the page buffer circuit shown in FIG. 3 according to an embodiment of the disclosed technology.

FIG. 4 is a schematic diagram illustrating patterns of bit-line connection nodes (BLCM) for use in the page buffer circuit shown in FIG. 3 according to an embodiment of the disclosed technology.

In the following description, in each of the low-voltage page buffer 210 and the high-voltage page buffer 220, a block in which each bit-line connection node (BLCM) is disposed will hereinafter be referred to as a "page buffer". For convenience of description and better understanding of the disclosed technology, the bit-line connection node (BLCM) will hereinafter be generically referred to as a "connection line".

In addition, the front letter "E" for use in each abbreviation may refer to an even page buffer in which an even connection line is disposed. The front letter "O" for use in each abbreviation may refer to an odd page buffer in which an odd connection line is disposed. In addition, each of the numerals 0, 2, 4, and 6 used in each abbreviation may correspond to an even group (Group A), and each of the numerals 1, 3, 5, and 7 for use in each abbreviation may correspond to an odd group (Group B).

Referring to FIG. 4, in the low-voltage page buffer 210, odd page buffers of a first stage may be configured with odd connection lines O0, O3, O4, and O7 arranged or disposed, in sequence in a first direction, to be contiguous. The odd page buffers may be configured in a manner such that odd connection lines (each having the front letter "O" in each abbreviation) from among even and odd groups are arranged contiguous or adjacent to one another, for example, as denoted by "O0(odd connection line/even group), O3(odd connection line/odd group), O4(odd connection line/even group), O7(odd connection line/odd group)" in FIG. 4.

In the low-voltage page buffer 210, even page buffers of a second stage, disposed in a second direction from the first stage of odd page buffers, may be configured with even connection lines E0, E3, E4, and E7 arranged, in a sequence in the first direction, contiguous or next to one another. The even page buffers may be configured in a manner so that even connection lines (each having the front letter "E" in each abbreviation) from among even and odd groups are arranged contiguous or adjacent to one another, for example, as denoted by "E0(even connection line/even group), E3(even connection line/odd group), E4(even connection line/even group), E7(even connection line/odd group)" in FIG. 4.

Each bit-line connection node (BLCM) coupled to the low-voltage page buffer 210 may also be coupled to the high-voltage page buffer 220. The bit-line connection nodes (BLCM) disposed in respective page buffers of the low-voltage page buffer 210 may be matched to corresponding regions, having the same reference numbers, in the high-voltage page buffer 220.

In the high-voltage page buffer 220, four sequential stages of page buffers may be arranged in the second direction. Odd page buffers of a first stage, disposed in a second direction from the second stage of even page buffers of the low-voltage page buffer 210, may be configured in a manner such that odd connection lines O0 and O4 are arranged contiguous to each other in the first direction. The odd page buffers may be configured in a manner such that odd connection lines (each having the front letter "O" in each abbreviation) from among even groups are arranged contiguous to each other, for example, as denoted by "O0(odd connection line/even group), O4(odd connection line/even group)".

In the high-voltage page buffer 220, even page buffers of a second stage may be configured in a manner such that even connection lines E0 and E4 are arranged adjacent to each other in the first direction. For example, even page buffers may be configured so that even connection lines (each having the front letter "E" in each abbreviation) from among even groups are arranged contiguous to each other, for example, as denoted by "E0(even connection line/even group), E4(even connection line/even group)".

In the high-voltage page buffer 220, odd page buffers of a third stage may be configured in a manner such that odd connection lines O3 and O7 are arranged contiguous to each other in the first direction. For example, odd page buffers may be configured so that odd connection lines (each having the front letter "O" in each abbreviation) from among odd groups are arranged contiguous to each other, for example, as denoted by "O3(odd connection line/odd group), O7(odd connection line/odd group)".

In the high-voltage page buffer 220, even page buffers of a fourth stage may be configured in a manner such that even connection lines E3 and E7 are arranged adjacent to each other in the first direction. For example, even page buffers may be configured so that even connection lines (each having the front letter "E" in each abbreviation) from among odd groups are arranged contiguous to each other, for example, as denoted by "E3(even connection line/odd group), E7(even connection line/odd group)".

Figure 5:
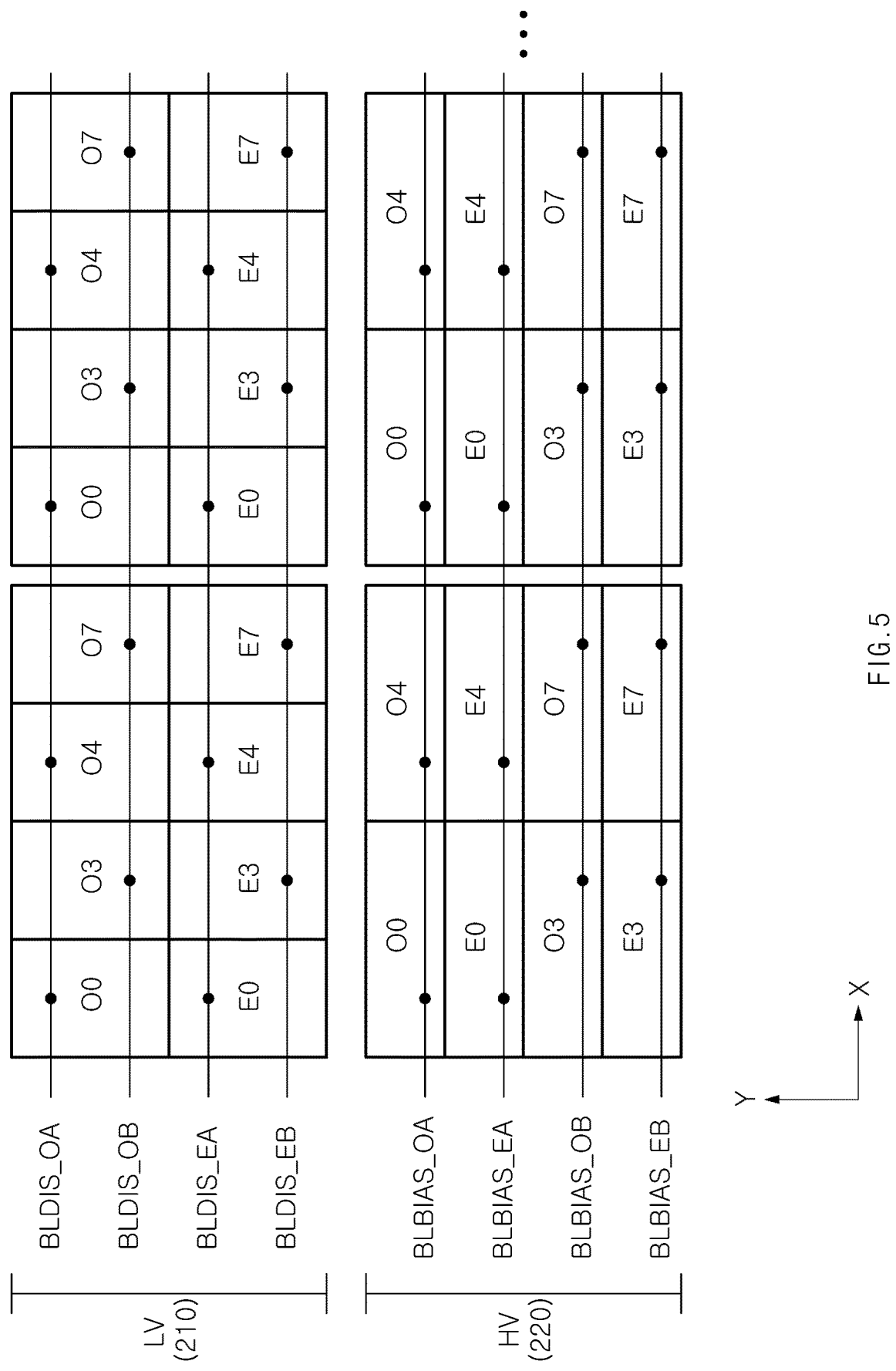
FIG. 5 is a schematic diagram illustrating control signals for use in the page buffer circuit shown in FIG. 4.

FIG. 5 is a schematic diagram illustrating control signals for use in the page buffer circuit shown in FIG. 4.

Referring to FIG. 5, in the page buffer circuit 200, a low-voltage page buffer 210 may receive page buffer control signals BLDIS_OA, BLDIS_OB, BLDIS_EA, and BLDIS_EB from a control signal generation circuit 250.

The page buffer control signal BLDIS_OA may be a bit-line discharge signal for controlling an even group of odd page buffers. The page buffer control signal BLDIS_OB may be a bit-line discharge signal for controlling an odd group of the odd page buffers. The page buffer control signal BLDIS_EA may be a bit-line discharge signal for controlling an even group of the even page buffers. The page buffer control signal BLDIS_EB may be a bit-line discharge signal for controlling an odd group of the even page buffers.

The high-voltage page buffer 220 may receive page buffer control signals BLBIAS_OA, BLBIAS_OB, BLBIAS_EA, and BLBIAS_EB from the control signal generation circuit 250.

The page buffer control signal BLBIAS_OA may be a bit-line test signal for controlling an even group of odd page buffers. The page buffer control signal BLBIAS_EA may be a bit-line test signal for controlling an even group of even page buffers. The page buffer control signal BLBIAS_OB may be a bit-line test signal for controlling an odd group of the odd page buffers. The page buffer control signal BLBIAS_EB may be a bit-line test signal for controlling the e odd group of the even page buffers.

Figure 6:
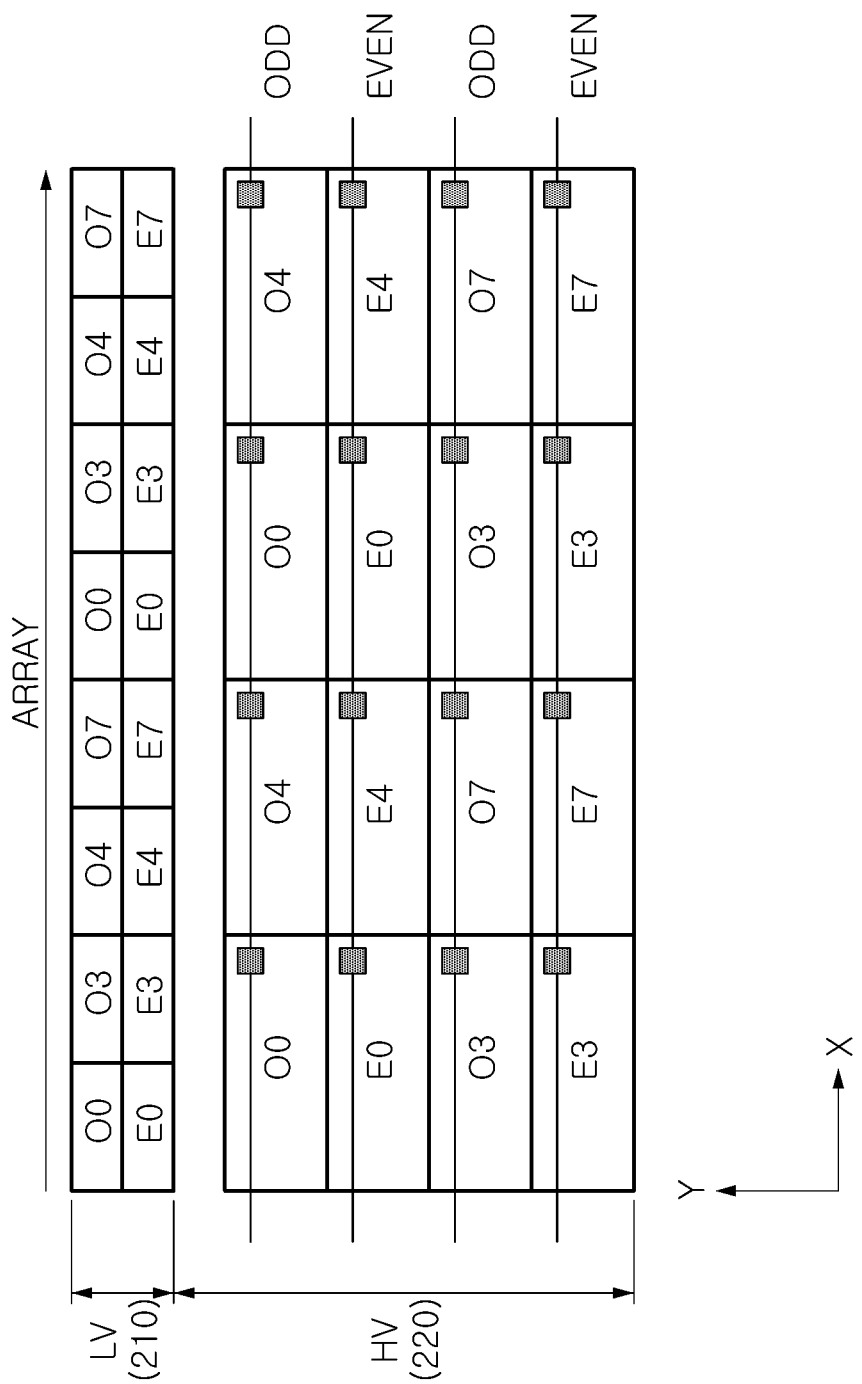
FIG. 6 is a schematic diagram illustrating patterns of bit-line connection nodes of the page buffer circuit shown in FIG. 4.

FIG. 6 is a schematic diagram illustrating patterns of bit-line connection nodes (BLCM) of the page buffer circuit shown in FIG. 4.

Referring to FIG. 6, in a page buffer circuit 200, each of the low-voltage page buffers 210 and the high-voltage page buffer 220 may be disposed in an array, in which the same structures as in FIG. 4 are repeatedly arranged or disposed in an X-axis, or first, direction.

For example, in the first stage of the low-voltage page buffer 210, odd connection lines O0, O3, O4, and O7 of the odd page buffers may be repeatedly arranged in an array extending in the X-direction. In the second stage of the low-voltage page buffer 210, even connection lines E0, E3, E4, and E7 of the even page buffers may be repeated in the X-axis direction.

In addition, the first stage of the high-voltage page buffer 220, disposed in the second direction from the low-voltage page buffer 210, may be configured so that the odd connection lines O0, O4, O0, and O4 of an even group, from among odd page buffers, are repeatedly arranged in the first direction. The second stage of the high-voltage page buffer 220 may be configured with even connection lines E0, E4, E0, and E4 of the even group, from among even page buffers, arranged in the X-direction.

Similarly, the third stage of the high-voltage page buffer 220 may be configured with odd connection lines O3, O7, O3, and O7 of the odd group, from among odd page buffers, arranged in the X-axis direction. The fourth stage of the high-voltage page buffer 220 may be configured in a manner such that the even connection lines E3, E7, E3, and E7 of the odd group, from among even page buffers, are arranged in the first direction.

Figure 7:
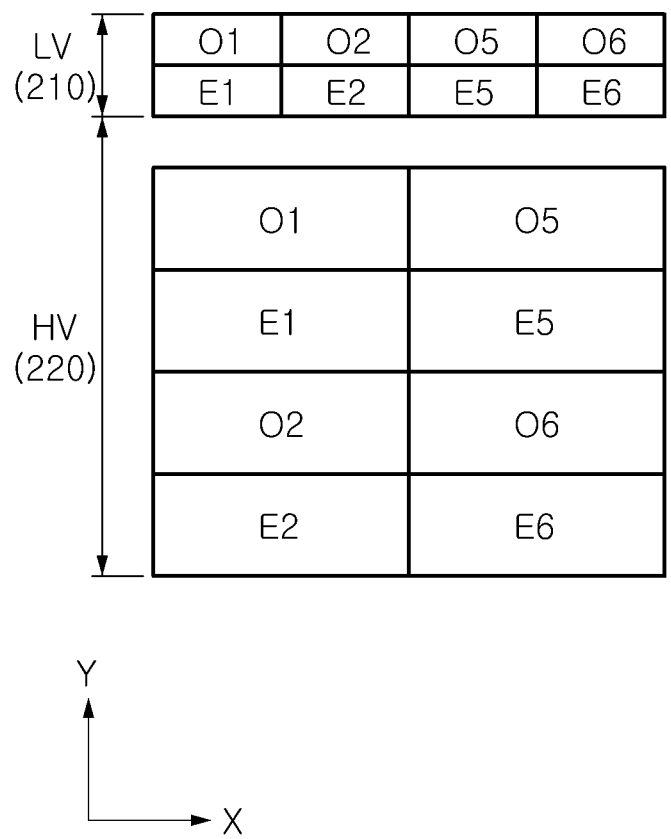
FIG. 7 is a schematic diagram illustrating patterns of bit-line connection nodes for use in the page buffer circuit shown in FIG. 3 according to an embodiment of the disclosed technology.

FIG. 7 is a schematic diagram illustrating patterns of bit-line connection nodes (BLCM) for use in the page buffer circuit shown in FIG. 3 according to an embodiment of the disclosed technology.

Referring to FIG. 7, in the low-voltage page buffer 210 of a page buffer circuit 200, the odd page buffers of the first stage may sequentially arrange odd connection lines O1, O2, O5, and O6 contiguous to one another in the first direction. The odd page buffers may be configured so that odd connection lines (each having the front letter "O" in each abbreviation), from among even and odd groups, are arranged or disposed adjacent to one another, for example, as denoted by "O1(odd connection line/odd group), O2(odd connection line/even group), O5(odd connection line/odd group), O6(odd connection line/even group)".

In the low-voltage page buffer 210, the even page buffers of the second stage may be configured so that the even connection lines E1, E2, E5, and E6 are arranged in sequence next to one another in the first direction. The even page buffers may be configured so that even connection lines (each having the front letter "E" in each abbreviation), from among even and odd groups, are arranged contiguous to one another, for example, as denoted by "E1(even connection line/odd group), E2(even connection line/even group), E5(even connection line/odd group), E6(even connection line/even group)".

In the high-voltage page buffer 220, the odd page buffers of the first stage may include the odd connection lines O1 and O5 that are arranged next to each other in the first direction. The odd page buffers may be configured in a manner such that odd connection lines (each having the front letter "O" in each abbreviation) from among odd groups are arranged contiguous to each other, for example, as denoted by "O1(odd connection line/odd group) and O5(odd connection line/odd group)".

In the high-voltage page buffer 220, the even page buffers of the second stage may include even connection lines E1 and E5 adjacent to each other in the first direction. The even page buffers may have even connection lines (each having the front letter "E" in each abbreviation), from among odd groups, that are arranged contiguous to each other, for example, as denoted by "E1(even connection line/odd group) and E5(even connection line/odd group)".

In the high-voltage page buffer 220, the odd page buffers of the third stage may have odd connection lines O2 and O6 that are arranged contiguous to each other in the first direction. The odd page buffers may be configured in a manner such that odd connection lines (each having the front letter "O" in each abbreviation) from among even groups are arranged next to each other, for example, as denoted by "O2(odd connection line/even group) and O6(odd connection line/even group)".

In the high-voltage page buffer 220, the even page buffers of the fourth stage may be configured such that the even connection lines E2 and E6 are arranged adjacent to each other in the first direction. The even page buffers may include even connection lines (each having the front letter "E" in each abbreviation) from among even groups that are arranged next to each other, for example, as denoted by "E2(even connection line/even group) and E6(even connection line/even group)".

Figure 8:
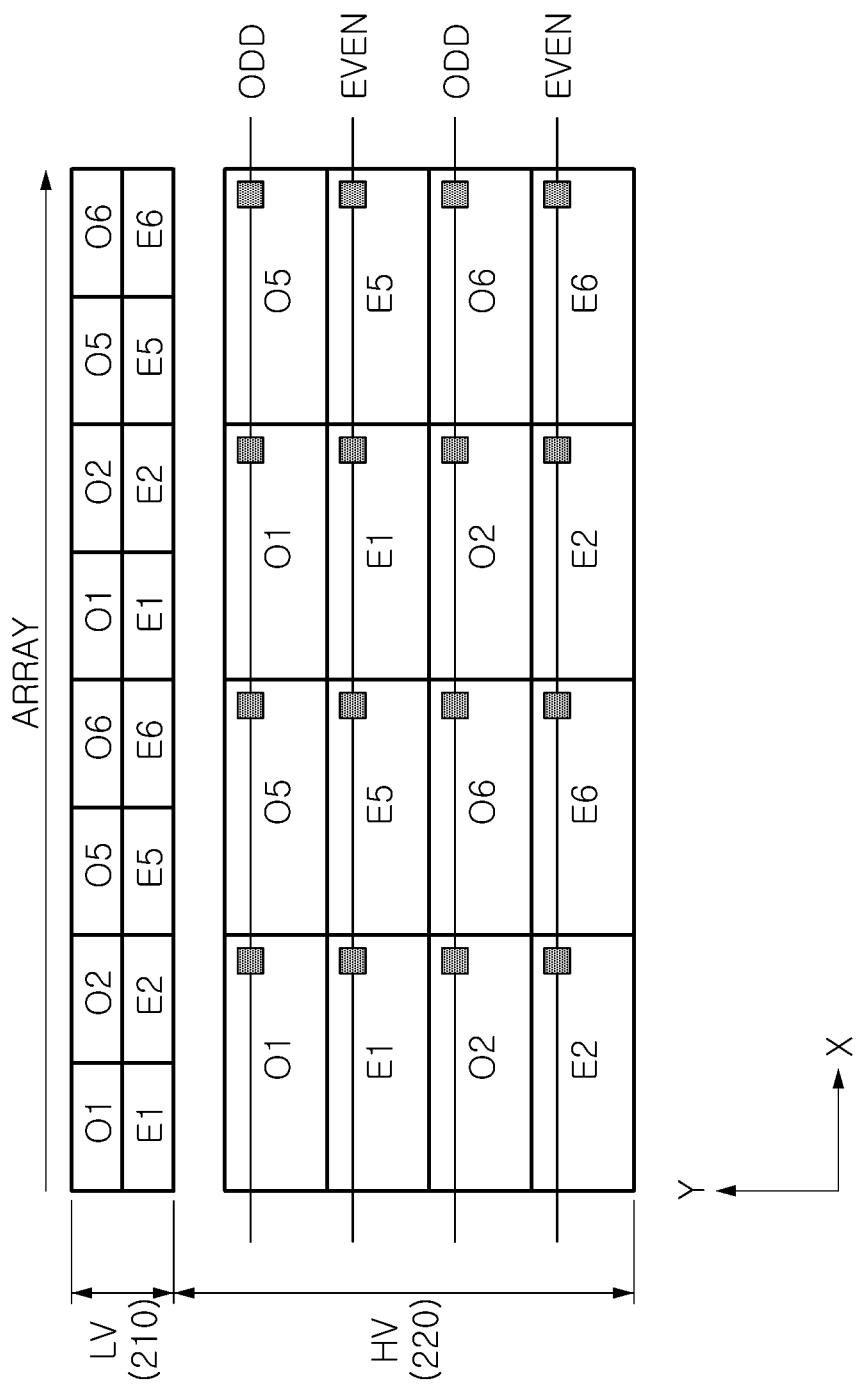
FIG. 8 is a schematic diagram illustrating patterns of the bit-line connection nodes of the page buffer circuit shown in FIG. 7.

FIG. 8 is a schematic diagram illustrating patterns of the bit-line connection nodes (BLCM) of the page buffer circuit shown in FIG. 7.

Referring to FIG. 8, in the page buffer circuit 200, each of the low-voltage page buffer 210 and the high-voltage page buffer 220 may be arranged in an array shape in which the same structures described in FIG. 7 are repeatedly arranged or disposed in the X-axis direction.

For example, in the first stage of the low-voltage page buffer 210, the odd connection lines O1, O2, O5, O6, O1, O2, O5, and O6 of the odd page buffers may be arranged in the X-directional array. In the second stage of the low-voltage page buffer 210, the even connection lines E1, E2, E5, E6, E1, E2, E5, and E6 of the even page buffers may be arranged in the X-directional array.

In the first stage of the high-voltage page buffer 220, disposed in the second direction from the low-voltage page buffer 210, odd connection lines O1, O5, O1, and O5 of the odd group, from among odd page buffers, may be arranged in the X-directional array in sequence in the first direction. In the second stage of the high-voltage page buffer 220, even connection lines E1, E5, E1, and E5 of the odd group, from among the even page buffers, may be arranged in the X-directional array in sequence in the first direction.

Similarly, in the third stage of the high-voltage page buffer 220, even connection lines O2, O6, O2, and O6 of an even group, from among odd page buffers, may be arranged in the X-directional array in sequence in the first direction.

In the fourth stage of the high-voltage page buffer 220, even connection lines E2, E6, E2, and E6 of an even group, from among even page buffers, may be arranged in the X-directional array in sequence in the first direction.

Figure 9:
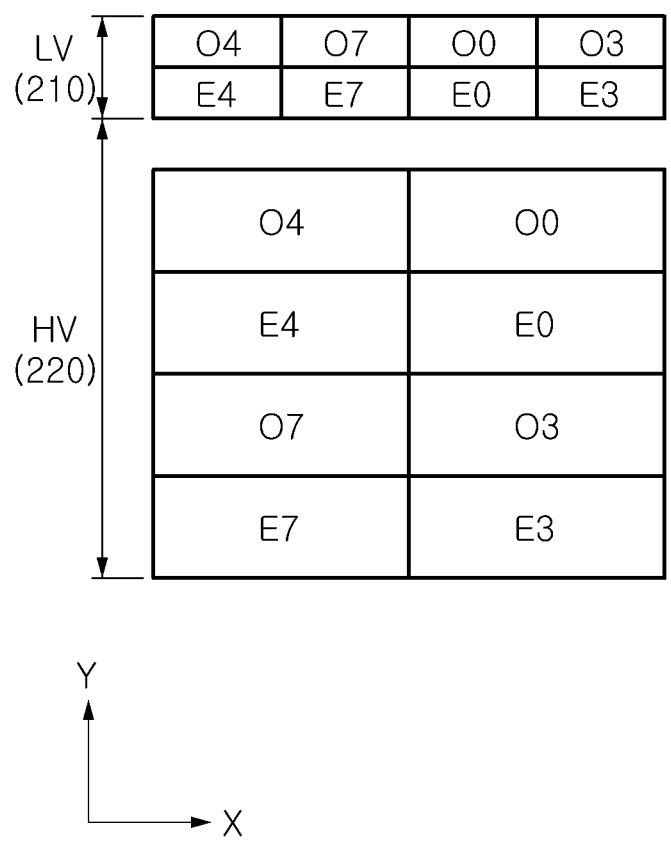
FIG. 9 is a schematic diagram illustrating patterns of bit-line connection nodes for use in the page buffer circuit shown in FIG. 3 according to an embodiment of the disclosed technology.

FIG. 9 is a schematic diagram illustrating patterns of bit-line connection nodes (BLCM) for use in the page buffer circuit shown in FIG. 3 according to an embodiment of the disclosed technology.

Referring to FIG. 9, in the first stage of the low-voltage page buffer 210 in a page buffer circuit 200, the odd page buffers may be configured in a manner such that the odd connection lines O4, O7, O0, and O3 are arranged or disposed sequentially in the first direction and adjacent to each another. The odd page buffers may be configured so that odd connection lines (each having the front letter "O" in each abbreviation), from among even and odd groups, are arranged next to one another, for example, as denoted by "O4(odd connection line/even group), O7(odd connection line/odd group), O0(odd connection line/even group), and O3(odd connection line/odd group)".

In the second stage of the low-voltage page buffer 210, the even page buffers may be configured so that the even connection lines E4, E7, E0, and E3 are arranged adjacent to each another in sequence in the first direction. The even page buffers may be configured in a manner such that even connection lines (each having the front letter "E" in each abbreviation), from among even and odd groups, are arranged adjacent to one another, for example, as denoted by "E4(even connection line/even group), E7(even connection line/odd group), E0(even connection line/even group), and E3(even connection line/odd group)".

In the first stage of the high-voltage page buffer 220, the odd page buffers may be configured in a manner such that the odd connection lines O4 and O0 are arranged contiguous or adjacent to each other in the first direction. The odd page buffers may be configured so that odd connection lines (each having the front letter "O" in each abbreviation) from among even groups are arranged contiguous or next to each other, for example, as denoted by "O4(odd connection line/even group), O0(odd connection line/even group)".

In the second stage of the high-voltage page buffer 220, the even page buffers may include even connection lines E4 and E0 next to each other in the first direction. The even page buffers may have even connection lines (each having the front letter "E" in each abbreviation), from among even groups, that are arranged contiguous to each other, for example, as denoted by "E4(even connection line/even group), E0(even connection line/even group)".

In the third stage of the high-voltage page buffer 220, the odd page buffers may be configured in a manner such that the odd connection lines O7 and O3 are arranged contiguous or adjacent to each other in the first direction. The odd page buffers may be configured in a manner such that odd connection lines (each having the front letter "O" in each abbreviation), from among odd groups, are arranged contiguous to each other, for example, as denoted by "O7(odd connection line/odd group), O3(odd connection line/odd group)".

In the fourth stage of the high-voltage page buffer 220, the even page buffers may be configured in a manner such that the even connection lines E7 and E3 are arranged next to each other in the first direction. The even page buffers may be configured in a manner such that even connection lines (each having the front letter "E" in each abbreviation), from among odd groups, are arranged contiguous to each other, for example, as denoted by "E7(even connection line/odd group), E3(even connection line/odd group)".

Figure 10:
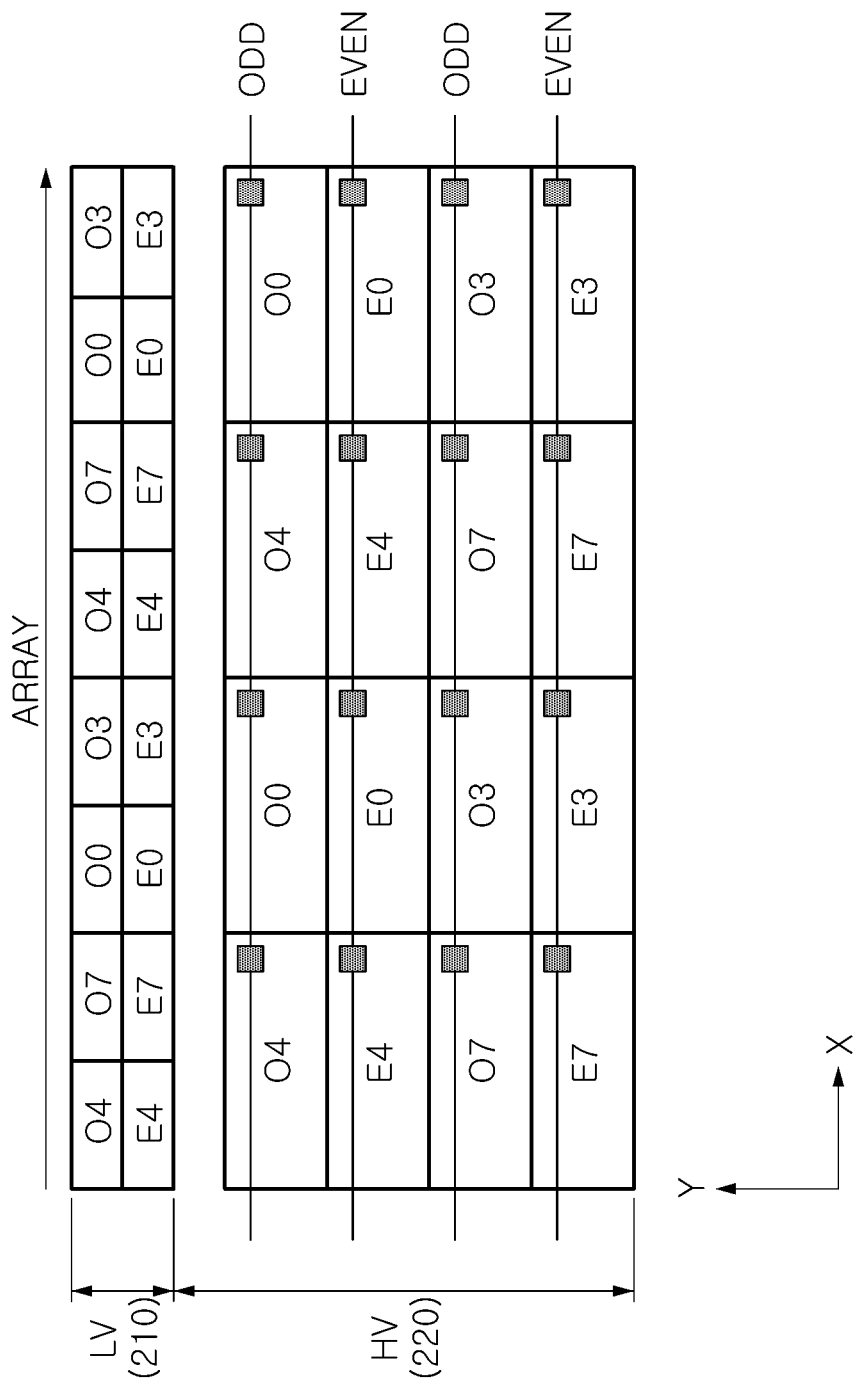
FIG. 10 is a schematic diagram illustrating patterns of bit-line connection nodes of the page buffer circuit shown in FIG. 9.

FIG. 10 is a schematic diagram illustrating patterns of the bit-line connection nodes (BLCM) of the page buffer circuit shown in FIG. 9.

Referring to FIG. 10, in the page buffer circuit 200, each of the low-voltage page buffer 210 and the high-voltage page buffer 220 may also be disposed in an array shape in which the same structures as described with reference to FIG. 9 are repeatedly arranged or disposed in the X-axis direction.

For example, in the first stage of the low-voltage page buffer 210, odd connection lines O4, O7, O0, and O3 of the odd page buffers may be repeatedly arranged in an array extending in the X-axis direction. In the second stage of the low-voltage page buffer 210, even connection lines E4, E7, E0, and E3 of the even page buffers may be repeated in the X-directional array.

In addition, the first stage of the high-voltage page buffer 220, disposed in the second direction from the low-voltage page buffer 210, may be configured in a manner such that odd connection lines O4, O0, O4, and O0 of an even group, from among odd page buffers, are arranged in the first direction in the array. The second stage of the high-voltage page buffer 220 may be configured with even connection lines E4, E0, E4, and E0 of an even group, from among even page buffers, are arranged in the X-direction.

Similarly, the third stage of the high-voltage page buffer 220 may be configured with odd connection lines O7, O3, O7, and O3 of an odd group, from among odd page buffers, are arranged in the X-direction in the array. The fourth stage of the high-voltage page buffer 220 may be configured in a manner such that even connection lines E7, E3, E7, and E3 of an odd group, from among even page buffers, are arranged in the X-directional array.

Figure 11:
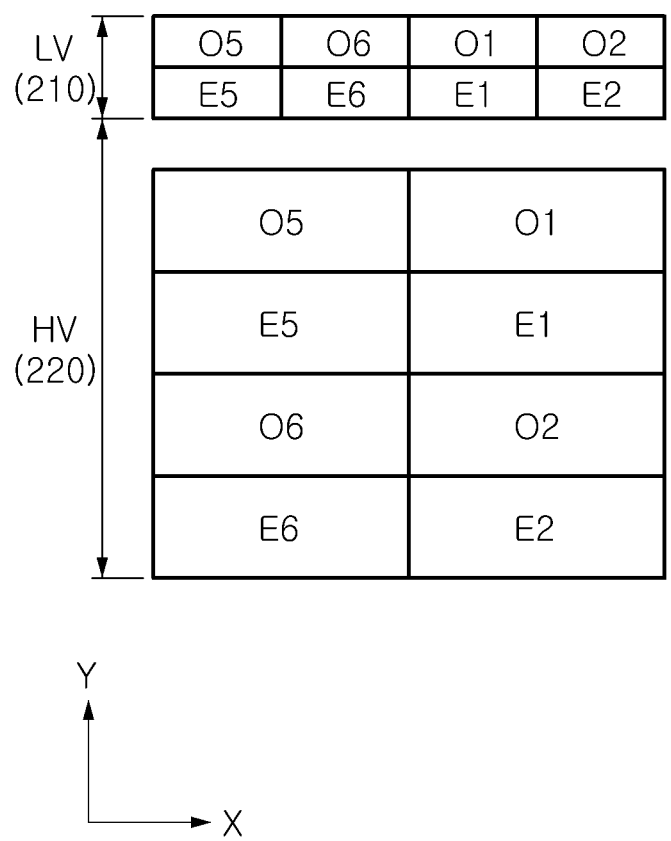
FIG. 11 is a schematic diagram illustrating patterns of bit-line connection nodes for use in the page buffer circuit shown in FIG. 3 according to an embodiment of the disclosed technology.

FIG. 11 is a schematic diagram illustrating patterns of bit-line connection nodes (BLCM) for use in the page buffer circuit shown in FIG. 3 according to an embodiment of the disclosed technology.

Referring to FIG. 11, in the low-voltage page buffer 210 of page buffer circuit 200, the odd page buffers of the first stage may be configured in a manner such that the odd connection lines O5, O6, O1, and O2 are arranged or disposed sequentially in the first direction and adjacent or contiguous to one another. The odd page buffers may be configured in a manner so that odd connection lines (each having the front letter "O" in each abbreviation), from among even and odd groups, are arranged contiguous or next to one another, for example, as denoted by "O5(odd connection line/odd group), O6(odd connection line/even group), O1(odd connection line/odd group), O2(odd connection line/even group)".

In the low-voltage page buffer 210, the even page buffers of the second stage may be configured with even connection lines E5, E6, E1, and E2 arranged contiguous to one another in sequence in the first direction. The even page buffers may be configured in such manner that even connection lines (each having the front letter "E" in each abbreviation), from among even and odd groups, are arranged contiguous or adjacent to one another, for example, as denoted by "E5(even connection line/odd group), E6(even connection line/even group), E1(even connection line/odd group), E2(even connection line/even group)".

In the high-voltage page buffer 220, the odd page buffers of the first stage may be configured in such manner that the odd connection lines O5 and O1 are arranged contiguous or next to each other in the first direction. The odd page buffers may be configured so that odd connection lines (each having the front letter "O" in each abbreviation), from among odd groups, are arranged contiguous or next to each other, for example, as denoted by "O5(odd connection line/odd group) and O1(odd connection line/odd group)".

In the high-voltage page buffer 220, the even page buffers of the second stage may include even connection lines E5 and E1 contiguous to each other in the first direction. The even page buffers may have even connection lines (each having the front letter "E" in each abbreviation), from among odd groups, are arranged contiguous to each other, for example, as denoted by "E5(even connection line/odd group) and E1(even connection line/odd group)".

In the high-voltage page buffer 220, the odd page buffers of the third stage may be configured in a manner such that the odd connection lines O6 and O2 are arranged contiguous or next to each other in the first direction. The odd page buffers may be configured in a manner so that odd connection lines (each having the front letter "O" in each abbreviation), from among even groups, are arranged contiguous to each other, for example, as denoted by "O6(odd connection line/even group) and O2(odd connection line/even group)".

In the high-voltage page buffer 220, the even page buffers of the fourth stage may be configured in a manner such that the even connection lines E6 and E2 are arranged contiguous or next to each other in the first direction. The even page buffers may be configured in a manner so that even connection lines (each having the front letter "E" in each abbreviation), from among even groups, are arranged contiguous to each other, for example, as denoted by "E6(even connection line/even group) and E2(even connection line/even group)".

Figure 12:
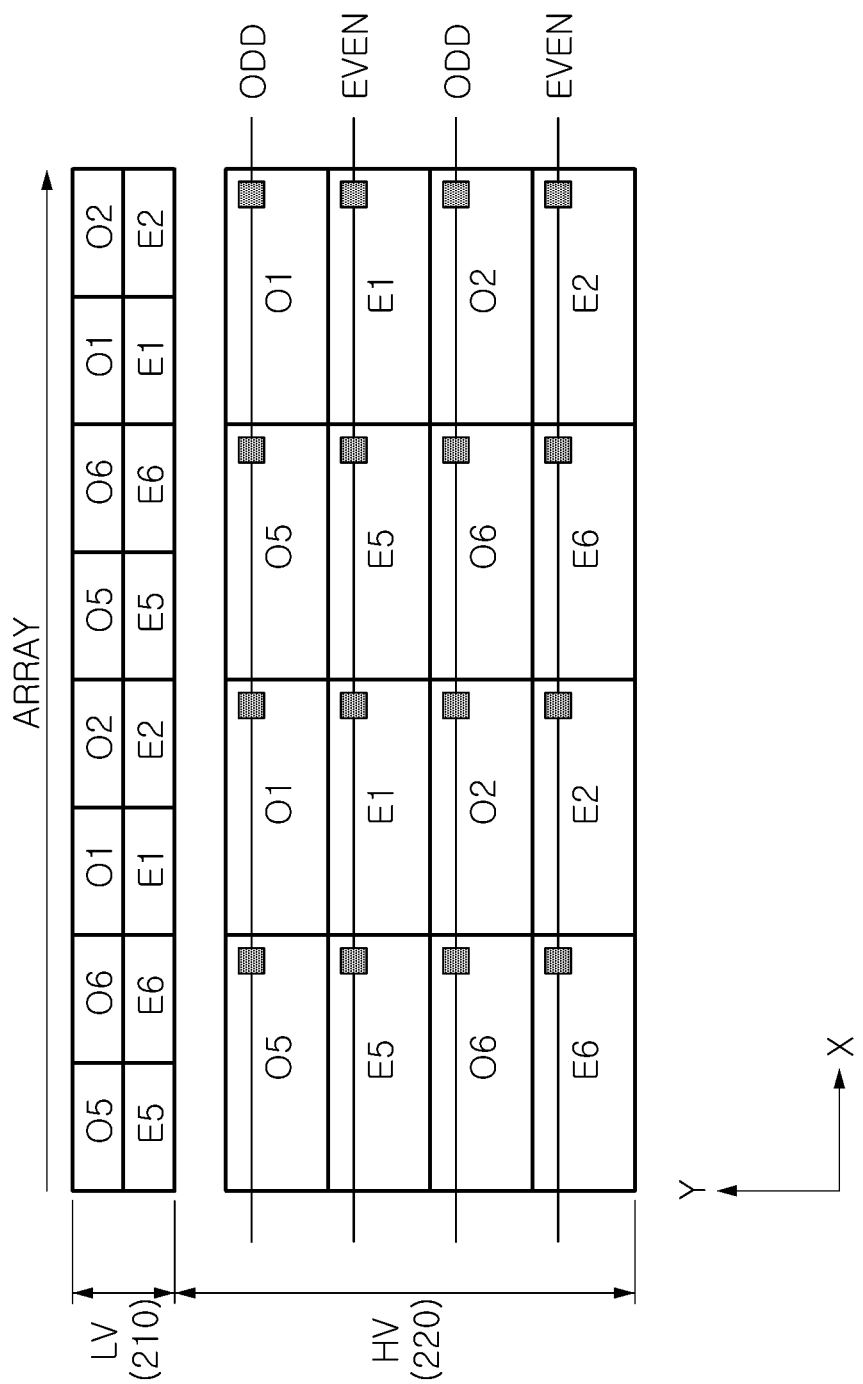
FIG. 12 is a schematic diagram illustrating in which patterns of bit-line connection nodes of the page buffer circuit shown in FIG. 11.

FIG. 12 is a schematic diagram illustrating patterns of the bit-line connection nodes (BLCM) of the page buffer circuit shown in FIG. 11.

Referring to FIG. 12, in the page buffer circuit 200, each of the low-voltage page buffer 210 and the high-voltage page buffer 220 may also be arranged or disposed in an array shape in which the same structures as described with reference to FIG. 11 are repeatedly arranged in the X-axis direction.

For example, in the first stage of the low-voltage page buffer 210, the odd connection lines O5, O6, O1, O2, and O2 of the odd page buffers may be repeatedly arranged in an array extending in the X-axis direction. In the second stage of the low-voltage page buffer 210, the even connection lines E5, E6, E1, and E2 of the even page buffers may be repeated in the X-directional array.

In the first stage of the high-voltage page buffer 220, disposed in the second direction from the low-voltage page buffer 210, odd connection lines O5, O1, O5, and O1 of an odd group, from among odd page buffers, may be arranged in the X-directional array. In the second stage of the high-voltage page buffer 220, even connection lines E5, E1, E5, and E1 of an odd group, from among even page buffers, may be arranged in the X-directional array.

In the third stage of the high-voltage page buffer 220, odd connection lines O6, O2, O6, and O2 of an even group, from among odd page buffers, may be arranged in the X-directional array. In the fourth stage of the high-voltage page buffer 220, even connection lines E6, E2, E6, and E2 of an even group, from among even page buffers, may be arranged in the X-directional array.

FIG. 13 is a schematic diagram illustrating page buffer circuits shown in FIGS. 4 to 12 stacked in multiple stages.

Referring to FIG. 13, a page buffer circuit 200 may be configured with the low-voltage page buffer 210 shown in FIG. 4 is arranged or disposed in a specific pattern (A). In addition, the same pattern as used in the low-voltage page buffer 210 shown in FIG. 4 may be disposed in a cache region (Ca).

The page buffer circuit 200 may be configured in a manner such that the low-voltage page buffer 210 shown in FIG. 7 is arranged in a pattern (B). In addition, the same pattern as in the low-voltage page buffer 210 shown in FIG. 7 may be disposed in a cache region (Ca).

If the page buffer circuits 200 are stacked in multiple stages, the low-voltage page buffer 210 shown in FIG. 4 may also be arranged in a pattern (C) in the same manner as in the pattern (A). In addition, the same pattern as used in the pattern (C) may be disposed in a cache region (Ca).

If the page buffer circuits 200 are stacked in multiple stages, the low-voltage page buffer 210 shown in FIG. 7 may be arranged in a pattern (D) in the same manner as in the pattern (B). In addition, the same patterns as used in the low-voltage page buffer 210 shown in FIG. 7 may be disposed in a cache region (Ca).

The page buffer circuit 200 may be configured in a manner so that the low-voltage page buffer 210 shown in FIG. 9 is arranged in a pattern (E). The same pattern as in the low-voltage page buffer 210 shown in FIG. 9 may be disposed in a cache region (Ca).

The page buffer circuit 200 may be configured in a manner such that the low-voltage page buffer 210 shown in FIG. 11 is arranged in a pattern (F). The same pattern as in the low-voltage page buffer 210 shown in FIG. 11 may also be disposed in a cache region (Ca).

As illustrated in FIG. 13, circuits for controlling the cache region (Cache) and the column selection decoder (CSDEC), which are needed to select one or more columns, may be located in regions interposed between the low-voltage page buffers 210.

Figure 14:
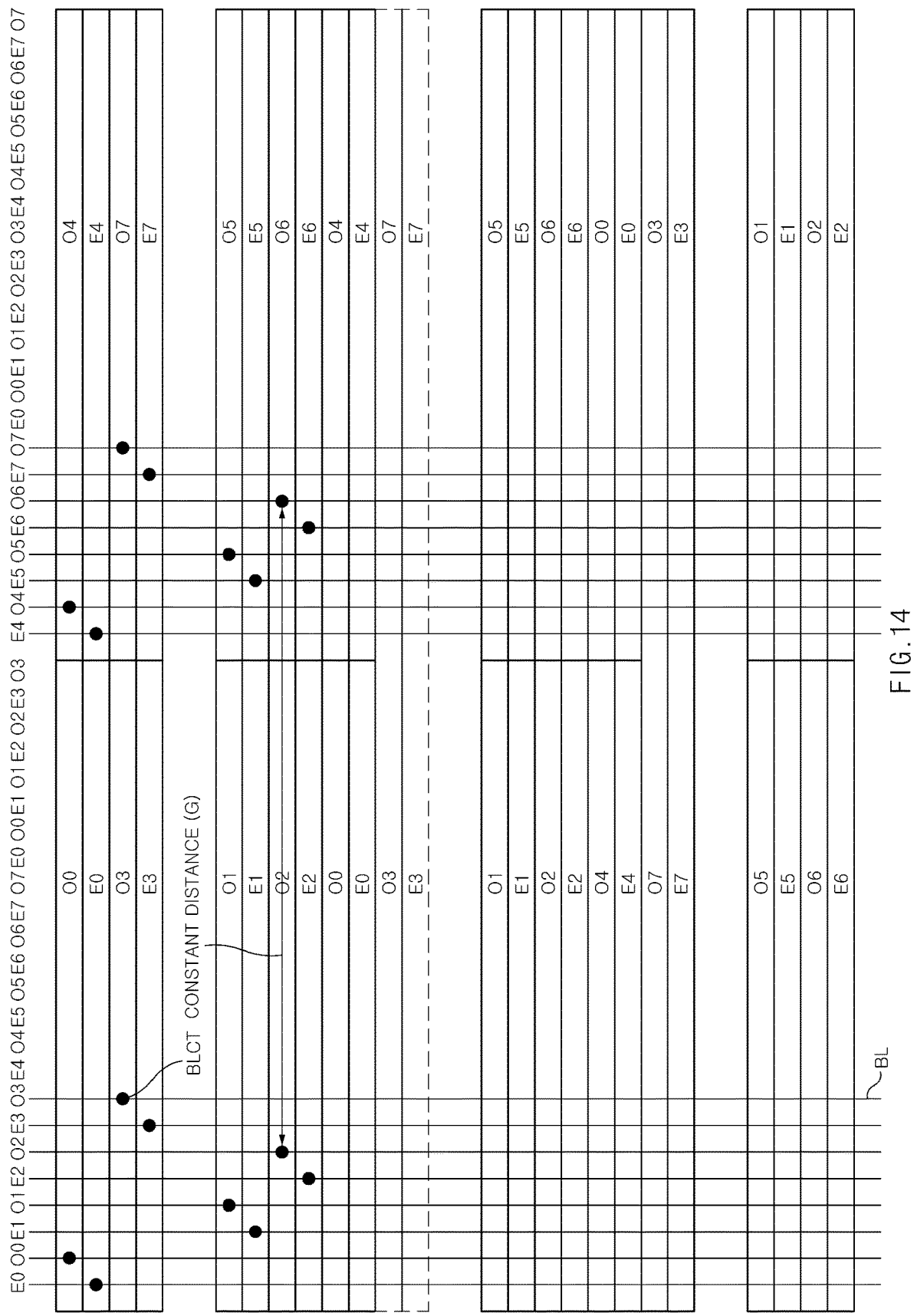
FIG. 14 is a conceptual diagram illustrating a method for matching bit lines to lines of the page buffer circuit in accordance with an embodiment of the disclosure.

FIG. 14 is a conceptual diagram illustrating a method for matching bit lines (BL) to lines of the page buffer circuit in accordance with an embodiment of the disclosure.

Referring to FIG. 14, bit lines (BL) of page buffer circuit 200 may be arranged or disposed in the order of patterns shown in FIG. 3, which are repeated in the first direction. The bit line (BL) and each line of the page buffer circuit 200 may be electrically coupled to each other through a bit-line contact (BLCT). The respective lines of the page buffer circuit 200 may be arranged as shown in the embodiments of FIGS. 4 to 13.

As described above, the respective positions of the bit-line contacts (BLCT) connected to the bit lines (BL) in the page buffer circuit 200 are spaced apart from one another by the same constant distance (G) or pitch, as shown in the pattern. If the bit-line connection nodes (BLCM) are arranged as described above, the bit lines (BL) can be spaced apart from one another by the same distance corresponding to a predetermined pitch, and at the same time, stress of the bit-line connection nodes (BLCM) can be tested.

Figure 15:
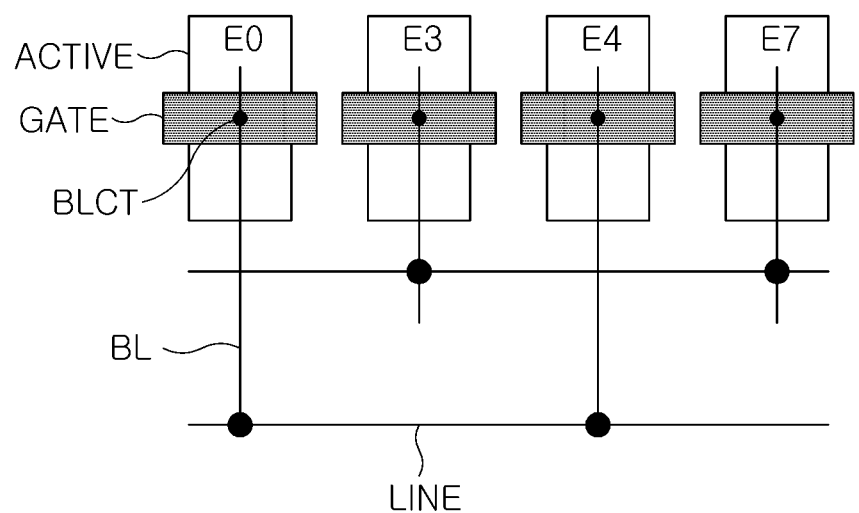
FIG. 15 is a schematic diagram illustrating gate patterns of a low-voltage page buffer circuit in accordance with an embodiment of the disclosure.

FIG. 15 is a schematic diagram illustrating gate patterns of a low-voltage page buffer in accordance with an embodiment of the disclosure.

Referring to FIG. 15, each of the page buffers E0, E3, E4, and E7, which are included in the low-voltage page buffer 210 shown in FIG. 4, may include a plurality of active regions (ACTIVE). The plurality of active regions (ACTIVE) may correspond to active regions of test transistors contained in the low-voltage page buffer 210.

Gate line patterns may be formed over the active regions (ACTIVE). The gate line patterns may be coupled to the bit lines (BL) through bit-line contacts (BLCT). As input signals of the respective gate line patterns are different from each other, the gate line patterns are short-circuited to correspond to the respective active regions (ACTIVE) while simultaneously being spaced apart from one another.

Figure 16:
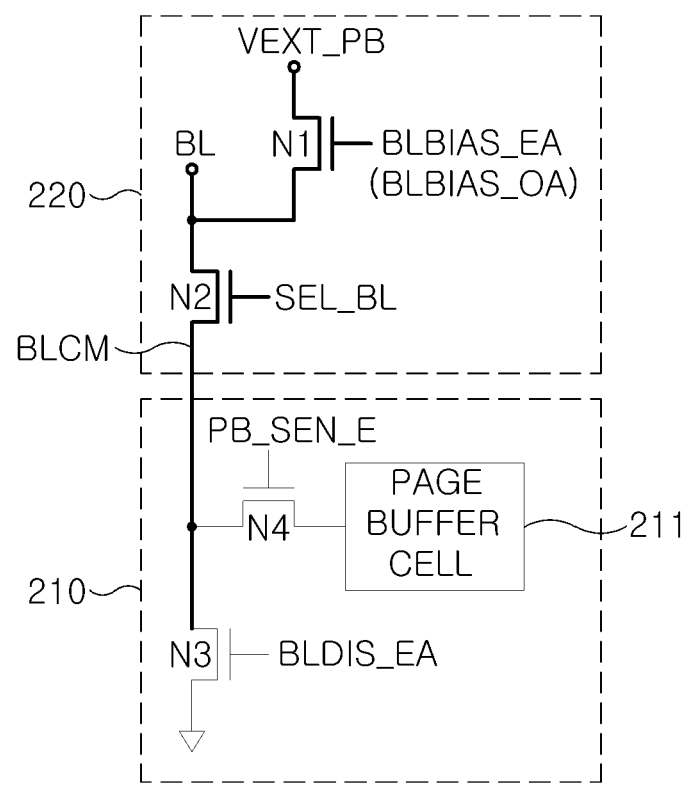
FIGS. 16 and 17 are detailed circuit diagrams illustrating the page buffer circuit shown in FIG. 2.
Figure 17:
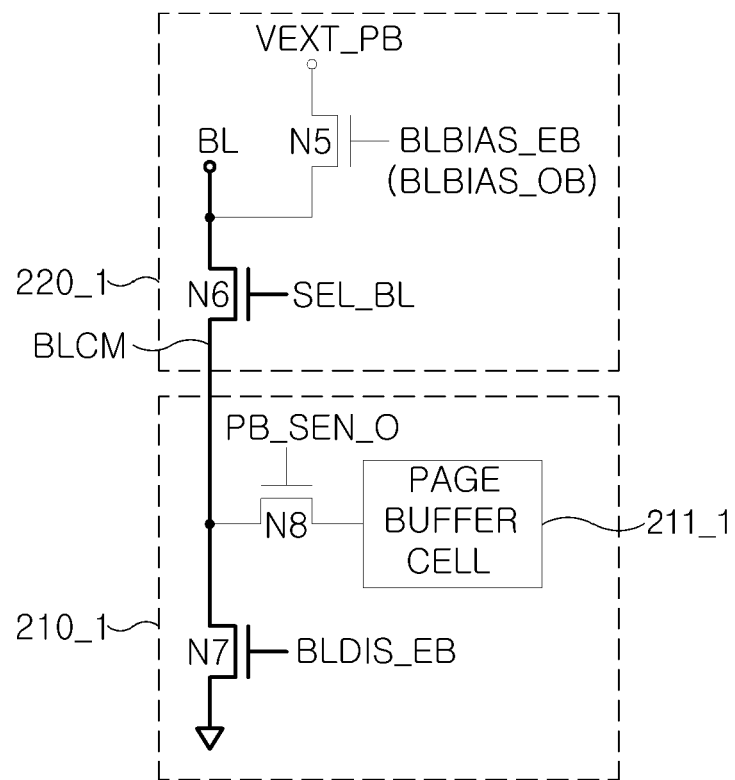

FIGS. 16 and 17 are detailed circuit diagrams illustrating the page buffer circuit shown in FIG. 2.

FIG. 16 is a circuit diagram illustrating a page buffer circuit 200 for use in an example in which the even bit line (BL) is selected. Referring to FIG. 16, a high-voltage page buffer 220 may include a plurality of NMOS transistors N1 and N2. The low-voltage page buffer 210 may include a plurality of NMOS transistors N3 and N4 and a page buffer cell 211.

An NMOS transistor N1 may be disposed between a power-supply voltage (VEXT_PB) input terminal and each bit line (BL), such that an NMOS transistor N1 may receive a bit-line test signal BLBIAS_EA or BLBIAS_OA through a gate terminal thereof. In this case, the bit-line test signal BLBIAS_EA or BLBIAS_OA may refer to one or more signals from group A (including EA and OA) bit line pairs shown in FIG. 3.

The NMOS transistor N2 may be coupled between the bit line (BL) and the bit-line connection node (BLCM), such that the NMOS transistor N2 may receive a bit-line selection signal SEL_BL through a gate terminal thereof. In this case, the bit-line selection signal SEL_BL may have a high-voltage power level (VHVPB).

The NMOS transistor N3 may be coupled between the bit-line connection node (BLCM) and a ground voltage terminal, such that the NMOS transistor N3 may receive a bit-line discharge signal BLDIS_EA through a gate terminal thereof. The NMOS transistor N4 may be coupled between the bit-line connection node (BLCM) and the page buffer cell 211, such that the NMOS transistor N4 may receive a sensing signal PB_SEN_E through a gate terminal thereof. In this case, the page buffer cell 211 may include a latch circuit, such that the latch circuit can latch data received from the bit-line connection node (BLCM) during activation of the sensing signal PB_SEN_E.

FIG. 17 is a circuit diagram illustrating a page buffer circuit for use in an example in which the even bit line (BL) is not selected. Referring to FIG. 17, the high-voltage page buffer 220_1 may include a plurality of NMOS transistors N5 and N6. The low-voltage page buffer 210_1 may include a plurality of NMOS transistors N7 and N8 and a page buffer cell 211_1.

The NMOS transistor N5 may be disposed between a power-supply voltage (VEXT_PB) input terminal and each bit line (BL), such that the NMOS transistor N5 may receive a bit-line test signal BLBIAS_EB or BLBIAS_OB through a gate terminal thereof. In this case, the bit-line test signal BLBIAS_EB or BLBIAS_OB may refer to one or more signals from group B (including EB and OB) bit line pairs shown in FIG. 3.

The NMOS transistor N6 may be coupled between the bit line (BL) and the bit-line connection node (BLCM), such that the NMOS transistor N6 may receive a bit-line selection signal SEL_BL through a gate terminal thereof. The NMOS transistor N7 may be coupled between the bit-line connection node (BLCM) and the ground voltage terminal, such that the NMOS transistor N7 may receive a bit-line discharge signal BLDIS_EB through a gate terminal thereof. The NMOS transistor N8 may be coupled between the bit-line connection node (BLCM) and the page buffer cell 211_1, such that the NMOS transistor N8 may receive a sensing signal PB_SEN_O through a gate terminal thereof.

Figure 18:
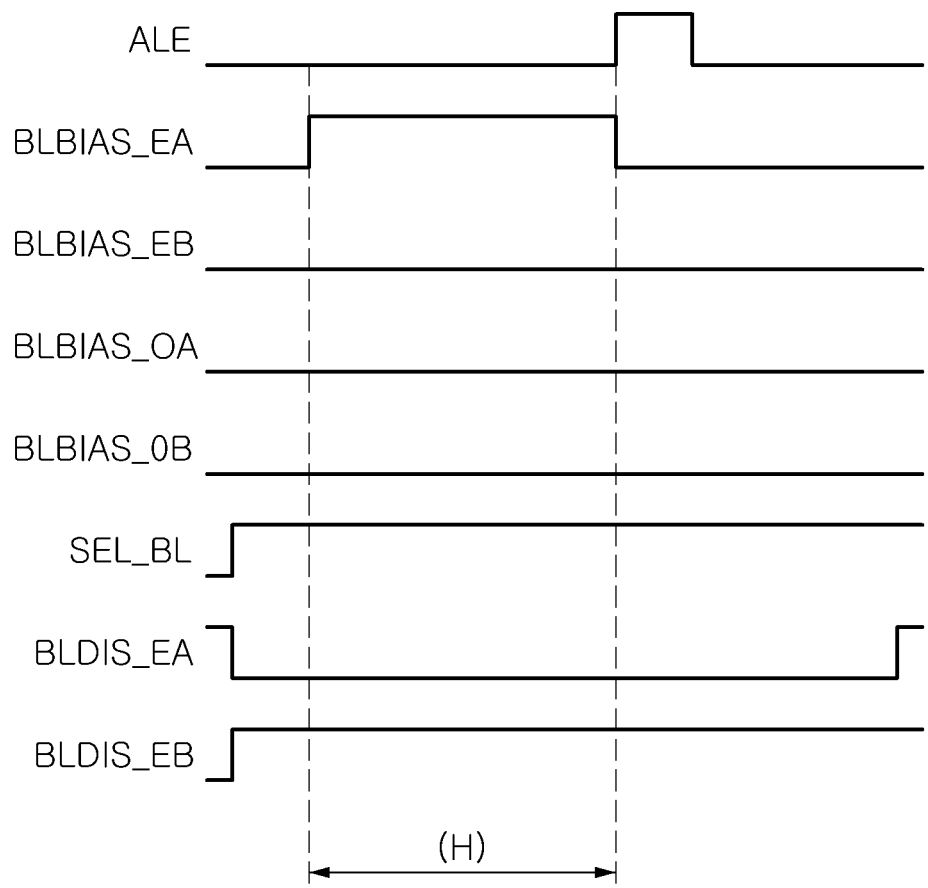
FIG. 18 is a timing diagram illustrating operations of the page buffer circuit shown in FIG. 16.

FIG. 18 is a timing diagram illustrating operations of the page buffer circuit shown in FIG. 16. FIG. 16 illustrates an example in which the even bit line (BL) of the group A (EA) is selected.

When a latch enable signal (ALE) is at a low level, the bit-line selection signal SEL_BL may be activated. As a result, the NMOS transistor N2 is turned on such that the bit line (BL) is coupled to the bit-line connection node (BLCM).

If the bit-line test signal BLBIAS_EA is activated, then the NMOS transistor N1 is turned on such that the power-supply voltage VEXT_PB is applied to the bit-line connection node (BLCM). In this case, each of the bit-line test signals BLBIAS_OA, BLBIAS_EB, and BLBIAS_OB may remain deactivated (or disabled). Therefore, during a given time period (H), a voltage needed to test stress of the bit-line connection node (BLCM) may be applied to the page buffer circuit 200.

When the latch enable signal (ALE) transitions to a high level, the bit-line test signal BLBIAS_EA may transition to a low level. As a result, the operation of testing the stress of the bit-line connection node (BLCM) may be ended.

As can be seen from an embodiment of FIG. 16, in order to test stress of the bit-line connection node (BLCM) in a situation in which the even bit line (BL) of the group A (EA) is selected, the bit-line discharge signal BLDIS_EA may remain at a low level.

Meanwhile, when the even bit line (BL) of the group A (EA) is selected, the even bit line (BL) of the group B (EB) is not selected as shown in the embodiment of FIG. 17. When the bit-line test signal BLBIAS_EB is deactivated, the NMOS transistor N5 may be turned off. When the bit-line selection line SEL_BL is activated, the NMOS transistor N6 is turned on such that the bit line (BL) and the bit-line connection node (BLCM) are coupled to each other.

When the bit-line discharge signal BLDIS_EB is activated, the NMOS transistor N6 is turned on such that the bit-line connection node (BLCM) may be discharged with a ground voltage level.

As is apparent from the above description, semiconductor devices based implementations of the disclosed technology can improve a layout structure of lines contained in the page buffer during a bit-line stress test mode.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a plurality of groups of bit lines, each group having a pair of first group bit lines and a pair of second group bit lines that are arranged in a first direction;
    a first page buffer circuit coupled to the plurality of groups of bit lines and a plurality of connection lines corresponding to the plurality of groups of bit lines; and
    a second page buffer circuit coupled to the plurality of connection lines,
    wherein the pair of first group bit lines includes a first odd bit line and a first even bit line,
    wherein the pair of second group bit lines includes a second odd bit line and a second even bit line,
    wherein the plurality of connection lines includes odd connection lines and even connection lines, and
    wherein the odd connection lines corresponding to first odd bit lines of a group of bit lines and second odd bit lines of an adjacent group of bit lines are grouped and arranged in an array pattern in the first direction, and the even connection lines corresponding to first even bit lines of a group of bit lines and second even bit lines of an adjacent group of bit lines are grouped and arranged in an array pattern in the first direction,
    wherein the second page buffer circuit includes:
        a plurality of odd page buffers arranged in the first direction, in which the odd connection lines are arranged contiguous to each other in the first direction; and
        a plurality of even page buffers arranged in the first direction, in which the even connection lines are arranged contiguous to each other in the first direction.

2. The semiconductor device according to claim 1, wherein the first page buffer circuit includes:
    a plurality of odd page buffers in which the odd connection lines are arranged contiguous to each other in the first direction; and
    a plurality of even page buffers in which the even connection lines are arranged contiguous to each other in the first direction.

3. The semiconductor device according to claim 2, wherein:
    page buffers that correspond to the first group bit lines, from among the plurality of odd page buffers and the plurality of even page buffers, are contiguous to each other in a second direction, and
    wherein with page buffers that correspond to the second group bit lines, from among the plurality of odd page buffers and the plurality of even page buffers, are arranged contiguous to each other in the second direction.

4. The semiconductor device according to claim 2, wherein:
    the plurality of odd page buffers is included in an array, in which a pattern of odd page buffers is repeatedly arranged in the first direction; and
    the plurality of even page buffers is included in an array, in which a pattern of even page buffers is repeatedly arranged in the first direction.

5. The semiconductor device according to claim 2, wherein the plurality of odd page buffers receives:
    a first bit-line test signal for controlling lines corresponding to the first group bit lines from among the odd connection lines; and a second bit-line test signal for controlling lines corresponding to the second group bit lines from among the odd connection lines.

6. The semiconductor device according to claim 2, wherein the plurality of even page buffers receives:
   a third bit-line test signal for controlling lines corresponding to the first group bit lines from among the even connection lines; and
   a fourth bit-line test signal for controlling lines corresponding to the second group bit lines from among the even connection lines.

7. The semiconductor device according to claim 1, wherein the first group bit lines or the second group bit lines of the first page buffer circuit is matched to the first group or second group of the second page buffer circuit, respectively, and to connection lines of the second page buffer circuit.

8. The semiconductor device according to claim 1, wherein the odd connection lines corresponding to the first odd bit lines of the first group bit lines and odd connection lines corresponding to the second odd bit lines of the second group bit lines are alternately arranged.

9. The semiconductor device according to claim 1, wherein the plurality of odd page buffers receives:
   a first bit-line discharge signal for controlling connection lines corresponding to the first group bit lines from among the odd connection lines; and
   a second bit-line discharge signal for controlling connection lines corresponding to the second group bit lines from among the odd connection lines.

10. The semiconductor device according to claim 1, wherein the even connection lines corresponding to even bit lines of the first group bit lines and even connection lines corresponding to even bit lines of the second group bit lines are alternately arranged.

11. The semiconductor device according to claim wherein the plurality of even page buffers receives:
    a third bit-line discharge signal for controlling connection lines, from among the even connection lines, corresponding to the first group bit lines; and
    a fourth bit-line discharge signal for controlling connection lines, from among the even connection lines, corresponding to the second group bit lines.

12. The semiconductor device according to claim 1, wherein:
    the plurality of odd page buffers and the plurality of even page buffers are configured such that page buffers corresponding to the first group bit lines are arranged contiguous to each other in a second direction and page buffers corresponding to the second group bit lines are arranged contiguous to each other in the second direction.

13. The semiconductor device according to claim 1, wherein:
    the plurality of odd page buffers is arranged in an array, in which a pattern of odd page buffers is repeatedly arranged in the first direction; and
    the plurality of even page buffers is arranged in an array, in which a pattern of even page buffers is repeatedly arranged in the first direction.

14. The semiconductor device according to claim 1, further comprising:
    a control signal generation circuit configured to transmit page buffer control signals to the first page buffer circuit and to the second page buffer circuit.

15. The semiconductor device according to claim 1, wherein the second page buffer circuit includes:
    a first transistor configured to selectively discharge the plurality of connection lines in response to a bit-line discharge signal; and
    a second transistor configured to transmit data of the plurality of connection lines to page buffers in response to a sensing signal,
    wherein, if one or more bit lines are selected during a test mode, then the bit-line discharge signal and the sensing signal are deactivated.

16. The semiconductor device according to claim 1, wherein the first page buffer circuit includes:
    a third transistor configured to transmit a first voltage to one or more bit lines in response to a bit-line test signal;
    a fourth transistor configured to selectively couple the bit line to a bit-line connection node in response to a bit-line selection signal,
    wherein, if the bit line is selected during a test mode, the bit-line test signal and the bit-line selection signal are activated.

17. A semiconductor device comprising:
    a plurality of groups of bit lines, each group having a pair of first group bit lines and a pair of second group bit lines that are arranged in a first direction; and
    a plurality of page buffers coupled to the plurality of groups of bit lines and a plurality of connection lines corresponding to the plurality of groups of bit lines,
    wherein the pair of first group bit lines includes a first odd bit line and a first even bit line,
    wherein the pair of second group bit lines includes a second odd bit line and a second even bit line,
    wherein the plurality of connection lines includes odd connection lines and even connection lines,
    wherein the odd connection lines corresponding to first odd bit lines of a group of bit lines and second odd bit lines of an adjacent group of bit lines are grouped and arranged in an array pattern in the first direction, and the even connection lines corresponding to first even bit lines of a group of bit lines and second even bit lines of an adjacent group of bit lines are grouped and arranged in an array pattern in the first direction, and
    wherein the plurality of page buffers includes:
    a plurality of odd page buffers coupled to odd connection lines of the first group bit lines and the second group bit lines, and the odd page buffers are arranged contiguous to each other in the first direction; and
    a plurality of even page buffers coupled to even connection lines of the first group bit lines and the second group bit lines, and the even page buffers are arranged contiguous to each other in the first direction,
    wherein the plurality of page buffers selectively discharge voltage of odd connection lines and even connection lines, and provide test voltage for a test operation to the plurality of bit lines.

18. The semiconductor device according to claim 17, wherein page buffers of the first group bit lines are arranged contiguous to each other in a second direction and page buffers of the second group are arranged contiguous to each other in the second direction.

19. The semiconductor device according to claim 17, wherein the plurality of page buffers is arranged in an array, in which a pattern of page buffers is repeatedly arranged in the first direction.

* * * * *